(12) United States Patent
Okamoto et al.

(10) Patent No.: US 10,375,821 B2
(45) Date of Patent: Aug. 6, 2019

(54) CONVERTER MOUNTING BOARD

(71) Applicant: FUJITSU LIMITED, Kawasaki-shi, Kanagawa (JP)

(72) Inventors: Kazuya Okamoto, Kawasaki (JP); Hironobu Kageyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 37 days.

(21) Appl. No.: 15/157,991

(22) Filed: May 18, 2016

(65) Prior Publication Data

US 2016/0352243 A1 Dec. 1, 2016

(30) Foreign Application Priority Data

May 25, 2015 (JP) ................. 2015-105381

(51) Int. Cl.
*H05K 1/00* (2006.01)
*H05K 1/02* (2006.01)
*H02M 1/44* (2007.01)
*H02M 3/156* (2006.01)
(Continued)

(52) U.S. Cl.
CPC ............ *H05K 1/0237* (2013.01); *H02M 1/44* (2013.01); *H05K 1/0243* (2013.01); *H05K 1/0265* (2013.01); *H02M 2003/1566* (2013.01); *H05K 1/113* (2013.01); *H05K 1/144* (2013.01); *H05K 2201/042* (2013.01); *H05K 2201/0979* (2013.01); *H05K 2201/09972* (2013.01); *H05K 2201/10166* (2013.01); *H05K 2201/10303* (2013.01)

(58) Field of Classification Search
CPC .. H05K 1/0237; H05K 1/0243; H05K 1/0265; H05K 1/113; H05K 1/144; H05K 2201/042; H05K 2201/0979; H05K 2201/09972; H05K 2201/10166; H05K 2201/10303; H02M 1/44; H02M 2003/1566
USPC ........................................................ 361/760
See application file for complete search history.

(56) References Cited

U.S. PATENT DOCUMENTS 6,456,049 B2 * 9/2002 Tsuji ...................... H02M 3/156
323/282
2006/0014444 A1 * 1/2006 Searls ............... H01L 23/49844
439/894

(Continued)

FOREIGN PATENT DOCUMENTS

JP 2007-282324 10/2007
JP 2012-235639 11/2012
JP 2013-546302 12/2013

OTHER PUBLICATIONS

Japanese Office Action dated Dec. 18, 2018 in corresponding Japanese Patent Application No. 2015-105381 (4 pages) (4 pages English Translation).

*Primary Examiner* — Pete T Lee
(74) *Attorney, Agent, or Firm* — Staas & Halsey LLP

(57) ABSTRACT

A converter mounting board includes: an electronic component which is supplied an electric current; a high-frequency DC-DC converter that supplies a direct current corresponding to a fast change of the electric current of the electronic component; and a low-frequency DC-DC converter located far away from the electronic component than the high-frequency DC-DC converter and supplies a direct current corresponding to a slow change of the electric current of the electronic component.

11 Claims, 16 Drawing Sheets

(51) Int. Cl.
    *H05K 1/11*    (2006.01)
    *H05K 1/14*    (2006.01)

(56)            References Cited

U.S. PATENT DOCUMENTS

2007/0257339 A1*  11/2007  Chen ................. H01L 23/5225
                                                        257/665
2009/0296360 A1*  12/2009  Doblar ................ H05K 1/0262
                                                        361/767
2012/0153907 A1*   6/2012  Carobolante ....... H02M 3/1588
                                                        323/266

* cited by examiner

CONVERTER MOUNTING BOARD

CROSS-REFERENCE TO RELATED APPLICATION

This application is based upon and claims the benefit of priority of the prior Japanese Patent Application No. 2015-105381, filed on May 25, 2015, the entire contents of which are incorporated herein by reference.

FIELD

The embodiments discussed herein are related to a converter mounting board.

BACKGROUND

There is a technique in which a plurality of DC-DC converters are mounted on a motherboard, and electric power supplied from a direct current (DC) power supply is distributed to the DC-DC converters and then supplied to a processor.

Furthermore, there is a technique in which a power supply device of an overvoltage protection circuit includes a main DC-DC converter and a sub-DC-DC converter.

When a DC-DC converter is disposed near an electronic component such as a processor (hereinafter, properly referred to as an "electronic component") to supply an electric current to the electronic component, a mounting space available for other components is narrowed in the vicinity of the electronic component. In particular, when a large DC-DC converter is disposed near the electronic component to supply a large current, a mounting space available for other components is further narrowed.

Whereas, a structure is also considered in which a DC-DC converter is mounted on a substrate that is separate from a load component mounting substrate and an electric current is supplied through a metal pillar, so that a mounting space available for other components is secured around the electronic component.

However, when a large amount of direct current having a high frequency (the current having a fast current variation) flows through the pillar, electromagnetic waves are radiated from the pillar as a radiation noise due to the current variation.

The followings are reference documents.
[Document 1] Japanese Laid-open Patent Publication No. 2007-282324 and
[Document 2] Japanese Laid-open Patent Publication No. 2012-235639.

SUMMARY

According to an aspect of the invention, a converter mounting board includes: an electronic component which is supplied an electric current; a high-frequency DC-DC converter that supplies a direct current corresponding to a fast change of the electric current of the electronic component; and a low-frequency DC-DC converter located far away from the electronic component than the high-frequency DC-DC converter and supplies a direct current corresponding to a slow change of the electric current of the electronic component.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A first embodiment will be described in detail with reference to the drawings.

Figure 1:
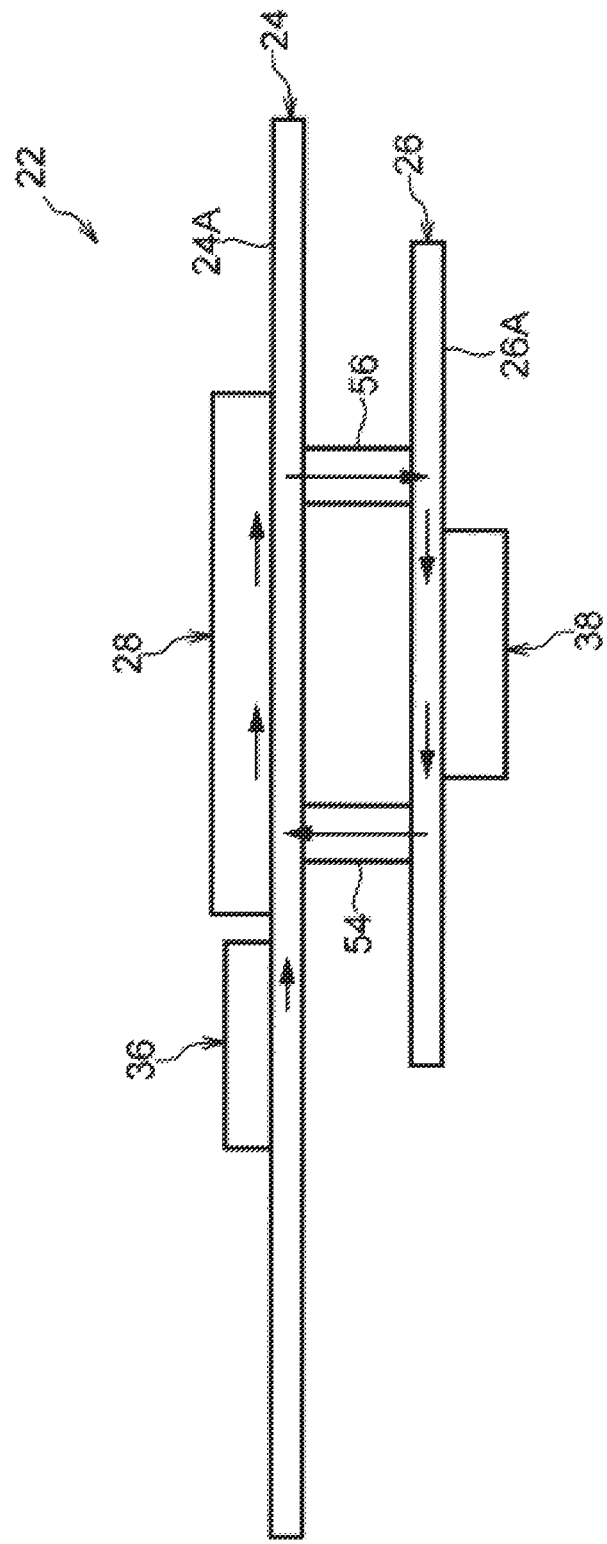
FIG. 1 is a front view illustrating a converter mounting board according to a first embodiment.
Figure 2:
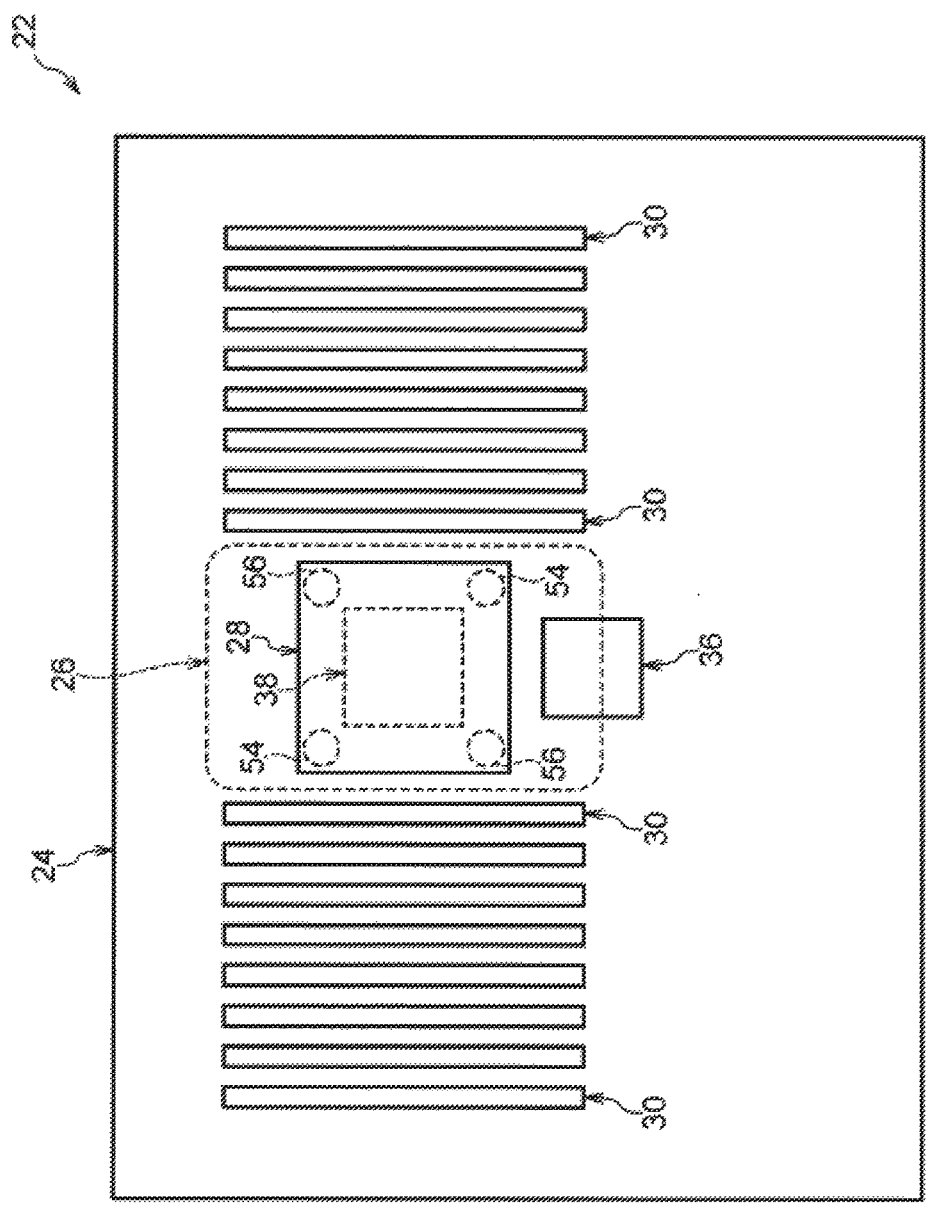
FIG. 2 is a plan view illustrating the converter mounting board according to the first embodiment.
Figure 3:
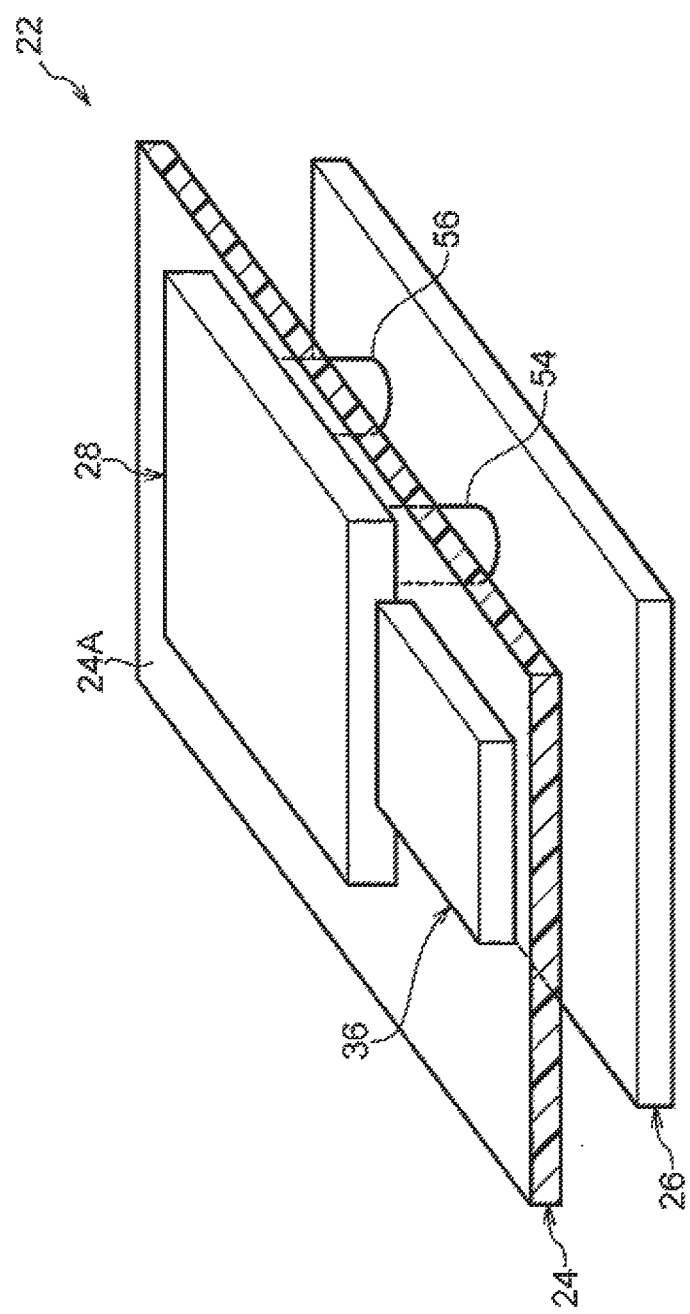
FIG. 3 is a perspective view partially illustrating the converter mounting board according to the first embodiment.

As illustrated in FIGS. 1 to 3, a converter mounting board 22 according to the first embodiment includes two substrates (e.g., a component mounting substrate 24 and a converter mounting substrate 26).

Each of the component mounting substrate 24 and the converter mounting substrate 26 is formed in a plate shape from an insulating and rigid material such as, for example, glass epoxy, paper phenol, or ceramic. In the example illustrated in FIG. 1, the component mounting substrate 24 and the converter mounting substrate 26 are arranged in parallel with (opposite to) each other at a predetermined interval.

In the component mounting substrate 24, a component mounting surface 24A is an opposite surface to the surface that faces the converter mounting substrate 26. A processor 28 and various kinds of electronic components 30 (not illustrated in FIGS. 1 and 3) (see, e.g., FIG. 2) are mounted on the component mounting surface 24A. The processor 28 is an exemplary electronic component. Specific examples of the electronic components 30 may include a memory chip and other electronic components such as an integrated circuit, a transformer, a transistor, a diode, a capacitor, a resistor, and a connector. FIG. 3 illustrates the component mounting substrate 24 in a partially cut-out state in which the cut surfaces are indicated with hatched lines.

Figure 4:
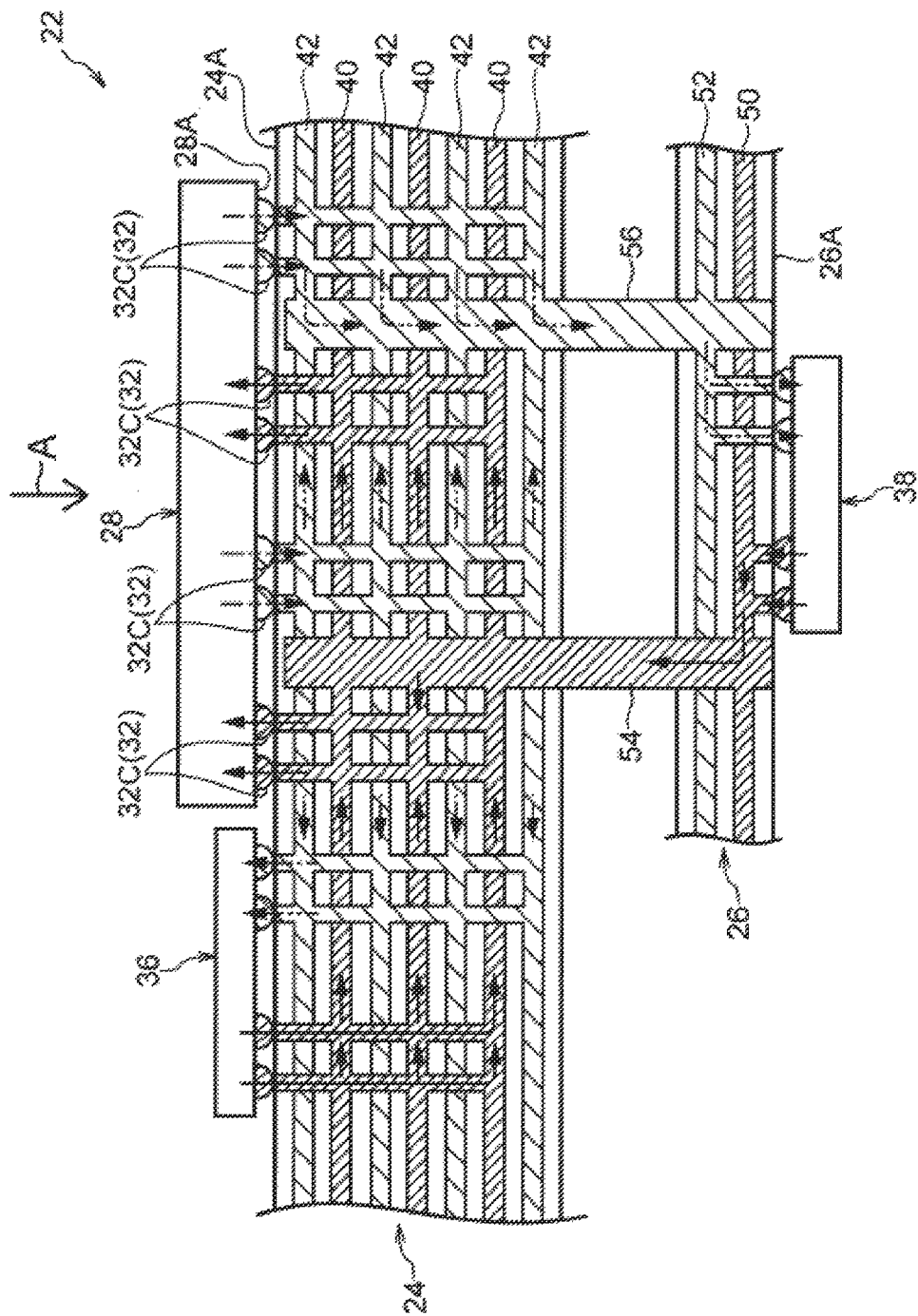
FIG. 4 is a vertical sectional view illustrating the converter mounting board according to the first embodiment.
Figure 5:
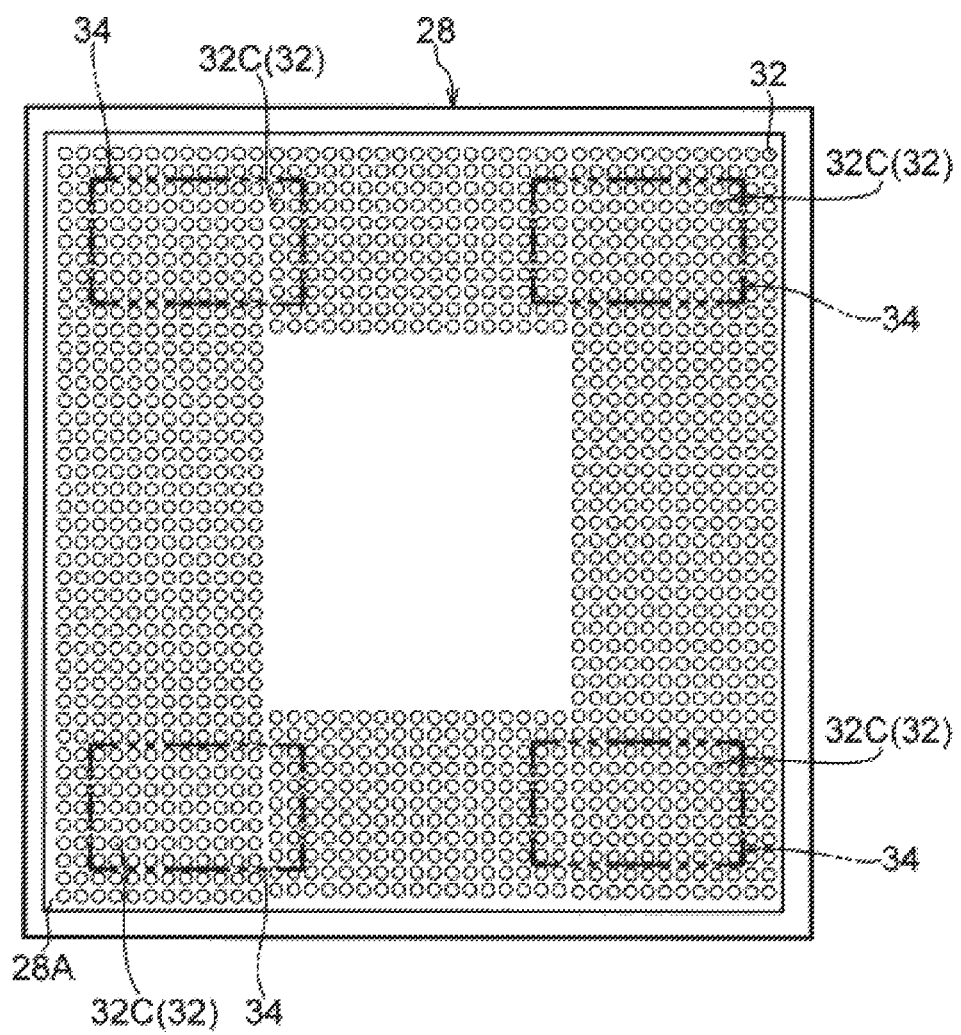
FIG. 5 is a bottom view illustrating a processor.

As illustrated in FIGS. 4 and 5, the processor 28 includes a plurality of terminals 32 that are disposed on a surface 28A that faces the component mounting substrate 24. Among the plurality of terminals 32, for example, the terminals disposed in the regions surrounded by frame lines 34 are power supply terminals 32C. That is, a plurality of power supply terminals 32C is dispersedly disposed on the surface 28A that is opposite to the component mounting substrate 24.

As illustrated in FIG. 1, a high-frequency DC-DC converter 36 is mounted on the component mounting surface 24A of the component mounting substrate 24. As illustrated in FIG. 4, plural layers of power supply wiring lines 40 and plural layers of ground wiring lines 42 are provided within the component mounting substrate 24. In addition, there is formed a current circuit extending from the high-frequency DC-DC converter 36, passing through the power supply wiring lines 40, the processor 28 and the ground wiring lines 42, and returning to the high-frequency DC-DC converter 36. This enables a direct current to be supplied from the high-frequency DC-DC converter 36 to the processor 28.

As described in FIG. 4, in the component mounting substrate 24, each power supply wiring line 40 is sandwiched between the adjacent ground wiring lines 42. In other words, the component mounting substrate 24 has a structure in which the ground wiring lines 42 are disposed above and below each power supply wiring line 40. The ground wiring lines 42 are exemplary wiring lines of shield members and configured to suppress the radiation of electromagnetic waves from the power supply wiring lines 40. The shield members are not limited to the ground wiring lines 42, but may be, for example, wiring lines of a predetermined voltage. Moreover, the shield members may be members that do not employ a wiring line structure such as, for example, members each having an electrically conductive plate shape.

As illustrated in FIG. 1, in the converter mounting substrate 26, the surface opposite from the surface opposed to the component mounting substrate 24 is a converter mounting surface 26A. A low-frequency DC-DC converter 38 is mounted on the converter mounting surface 26A.

Figure 6:
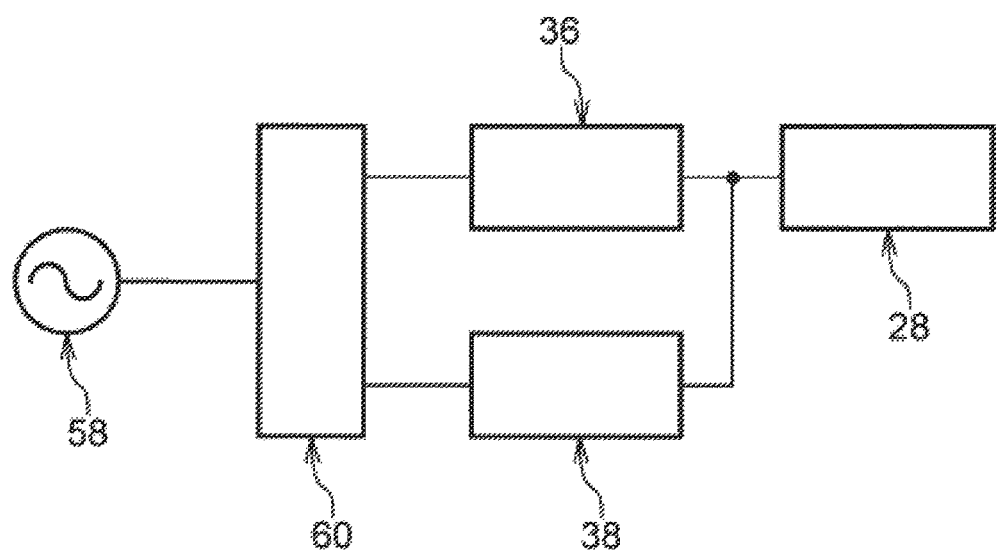
FIG. 6 is a power supply block diagram of the converter mounting board according to the first embodiment.

In the present embodiment, each of the high-frequency DC-DC converter 36 and the low-frequency DC-DC converter 38 is a converter that, when a direct current is input thereto, converts the voltage value or current value of the input direct current, and outputs a direct current, i.e. a DC-DC converter. As illustrated in FIG. 6, each of the high-frequency DC-DC converter 36 and the low-frequency DC-DC converter 38 may employ, for example, a structure that receives a direct current from an AC-DC converter 60. The AC-DC converter 60 converts an alternating current input from an AC power supply 58 into a direct current. That is, the alternating current supplied from the AC power supply 58 is converted into a direct current by the AC-DC converter 60 and then the direct current is supplied to the high-frequency DC-DC converter 36 and the low-frequency DC-DC converter 38. In the present embodiment, each of the high-frequency DC-DC converter 36 and the low-frequency DC-DC converter 38 is not limited to the DC-DC converter, but may be an AC-DC converter.

Figure 7:
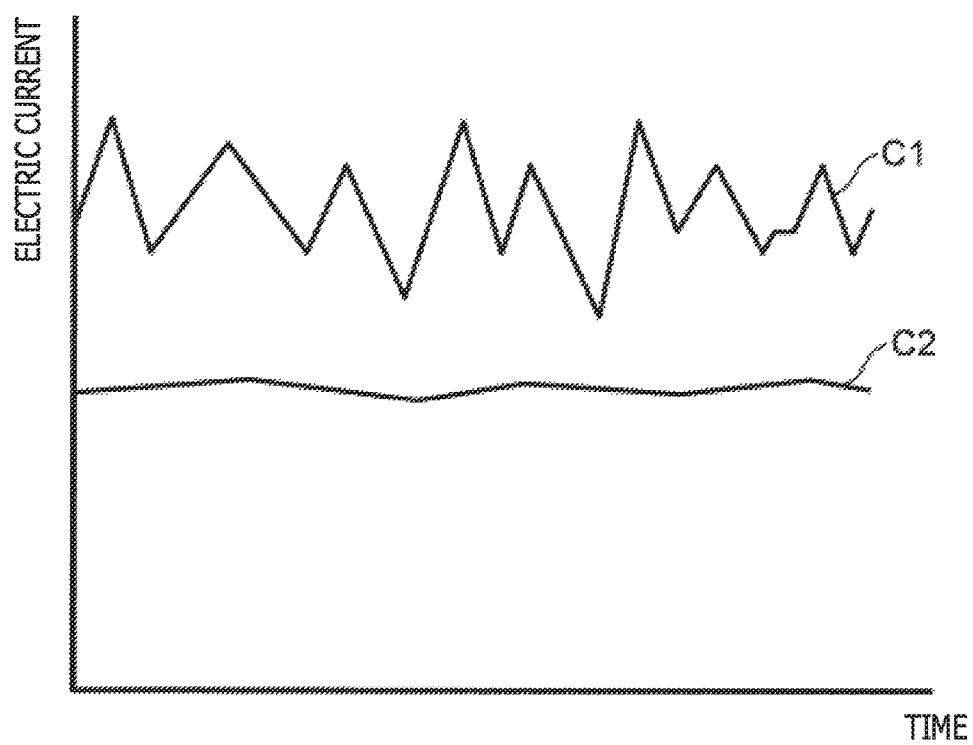
FIG. 7 is a graph illustrating a temporal variation of an electric current supplied to the processor.

As illustrated in FIG. 7, an electric current C2 supplied from the low-frequency DC-DC converter 38 and an electric current C1 supplied from the high-frequency DC-DC converter 36 are synthesized to be supplied to the processor 28.

As illustrated in FIG. 4, a power supply wiring line 50 and a ground wiring line 52 are provided within the converter mounting substrate 26. Furthermore, the component mounting substrate 24 and the converter mounting substrate 26 are connected by pillars 54 and 56. Each of the pillars 54 and 56 is formed in a rod shape (columnar shape) by an electrically conductive and rigid material such as, for example, copper. A current circuit is formed extending from the low-frequency DC-DC converter 38, passing through the power supply wiring line 50, the pillar 54, the power supply wiring lines 40, the processor 28, the ground wiring lines 42, the pillar 56, and the ground wiring line 52, and returning to the low-frequency DC-DC converter 38. This enables a direct current to be supplied from the low-frequency DC-DC converter 38 to the processor 28.

The pillars 54 and 56 are connected to the component mounting substrate 24 at the side opposite to the component mounting surface 24A. In the example illustrated in FIG. 4, when the component mounting substrate 24 is viewed in a plan view (in a direction indicated by an arrow A in FIG. 4), the pillars 54 and 56 are disposed in the positions overlapping with the power supply terminals 32C (see, e.g., FIG. 5). However, the pillars 54 and 56 may be disposed in the positions that do not overlap with the power supply terminals 32C.

Figure 8:
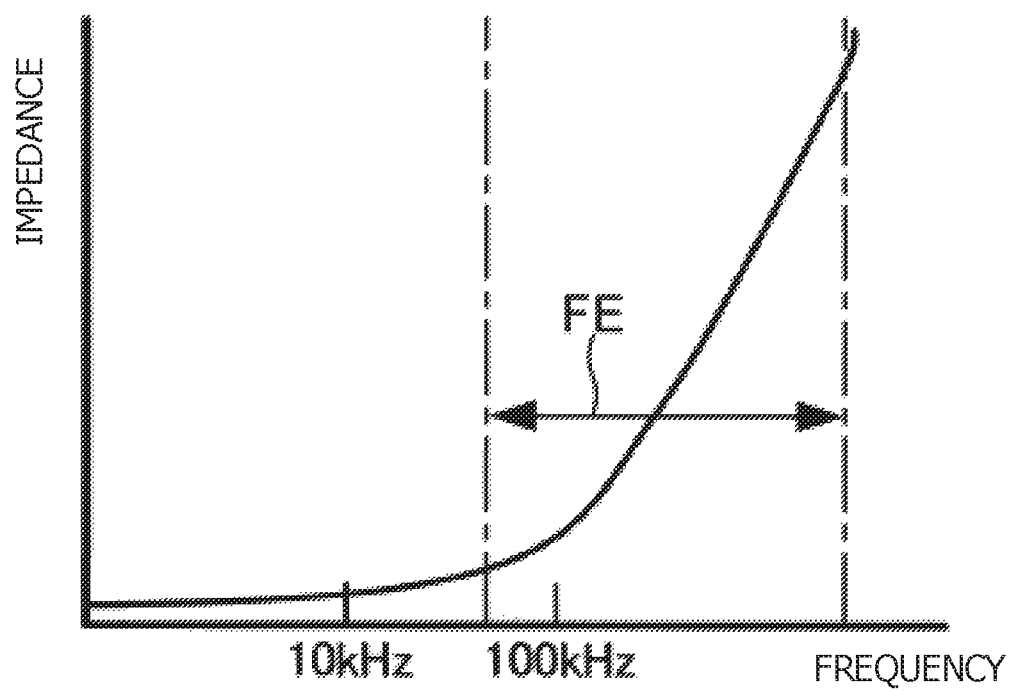
FIG. 8 is a graph illustrating a relationship between a frequency and impedance in a high-frequency DC-DC converter.
Figure 9:
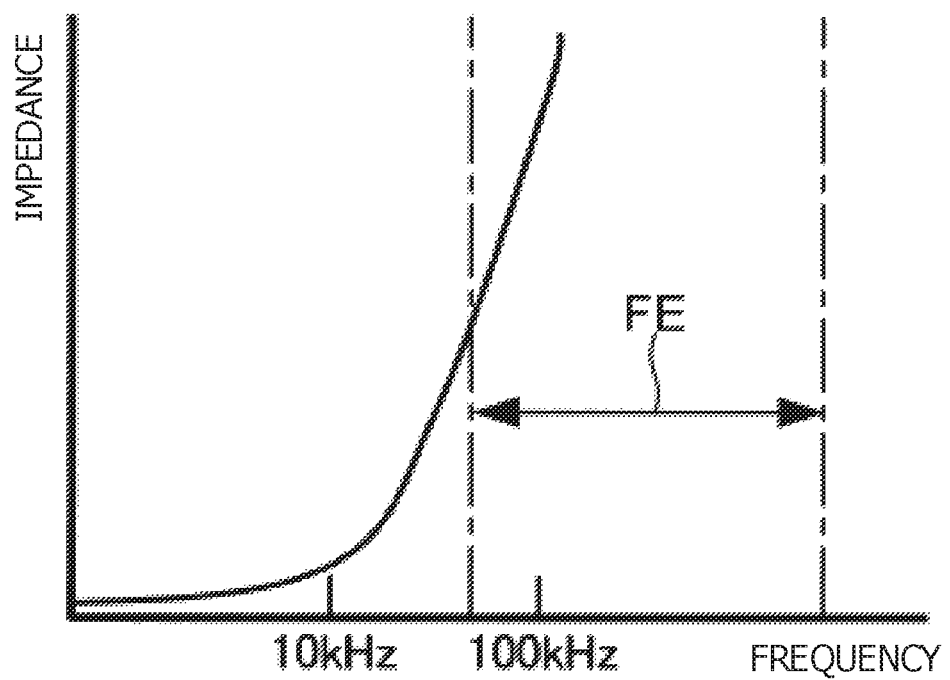
FIG. 9 is a graph illustrating a relationship between a frequency and impedance in a low-frequency DC-DC converter.
Figure 10:
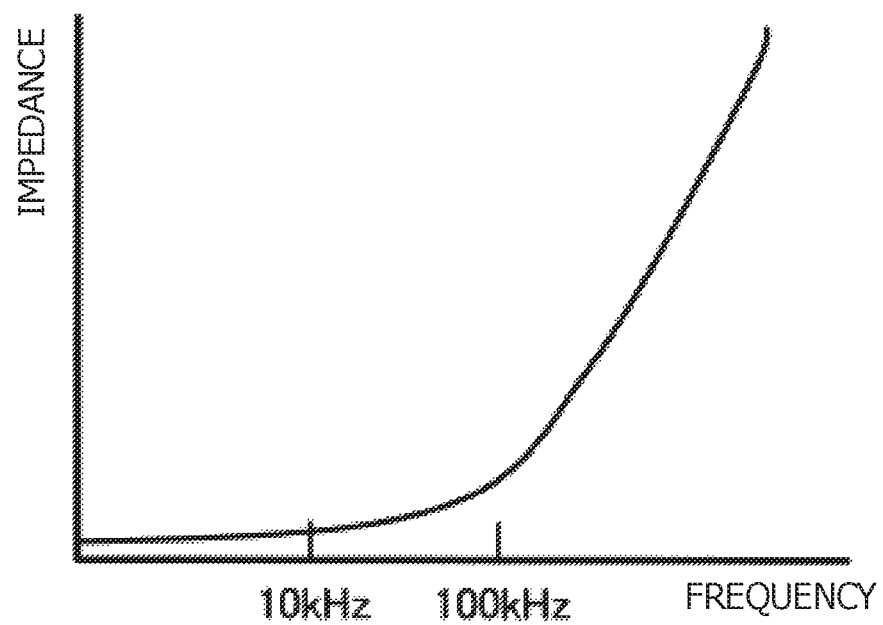
FIG. 10 is a graph illustrating a relationship between a frequency and impedance in the case where a high-frequency DC-DC converter and a low-frequency DC-DC converter are synthesized.

FIG. 8 represents an output impedance characteristic of the high-frequency DC-DC converter 36, and FIG. 9 represents an output impedance characteristic of the low-frequency DC-DC converter 38. In fact, the high-frequency DC-DC converter 36 and the low-frequency DC-DC converter 38 are combined with each other to exhibit the output impedance characteristic illustrated in FIG. 10.

As described the comparison of FIGS. 8 and 9, the output impedance of the high-frequency DC-DC converter 36 is lower than the output impedance of the low-frequency DC-DC converter 38 at the same frequency. In other words, while the output impedances of both of the high-frequency DC-DC converter 36 and the low-frequency DC-DC converter 38 become higher as the frequency increases, the output impedance increases more largely in the low-frequency DC-DC converter 38 than in the high-frequency DC-DC converter 36 with the increasing frequency. In particular, in a frequency range FE where a radiation noise is easily generated due to a temporal variation of an electric current within a wiring line (in a high frequency range), the impedance of the low-frequency DC-DC converter 38 is higher than the impedance of the high-frequency DC-DC converter 36.

Figure 11:
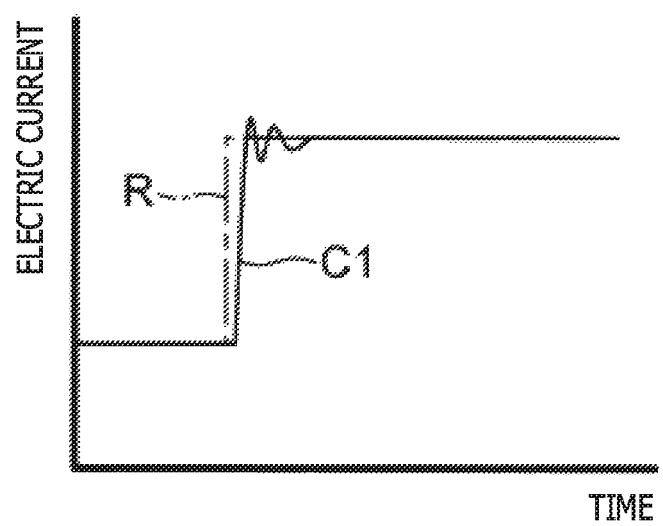
FIG. 11 is a graph illustrating a time response of an output current in a high-frequency DC-DC converter.

FIG. 11 represents a temporal variation of an electric current (a load current indicated by a single-dot chain line R) to be supplied to the processor 28 and an electric current (an output current indicated by a solid line C1) actually output from the high-frequency DC-DC converter 36. Similarly, FIG. 12 represents a temporal variation of an electric current (a load current indicated by a single-dot chain line R) to be supplied to the processor 28 and an electric current (an output current indicated by a solid line C2) actually output from the low-frequency DC-DC converter 38.

In the high-frequency DC-DC converter 36, since the output impedance in the high frequency range FE is low, the response of the output current with respect to the change of the load current is fast, as described in FIG. 11. That is, in the high-frequency DC-DC converter 36, the followability with respect to the fluctuation of the load current of high frequency is high.

Figure 12:
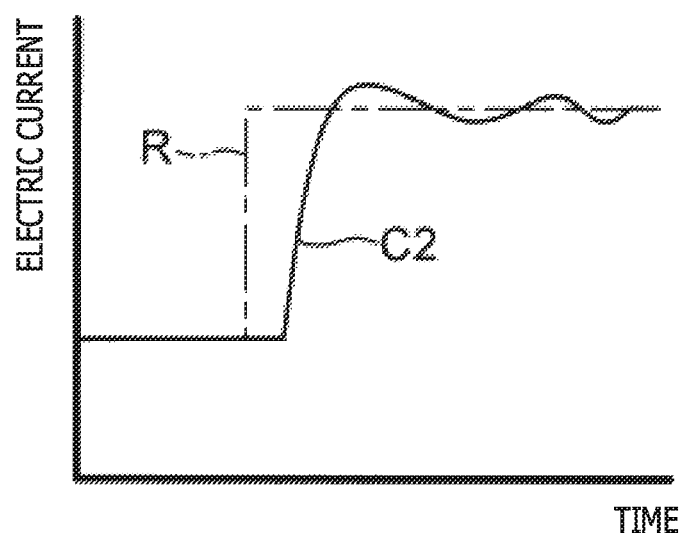
FIG. 12 is a graph illustrating a time response of an output current in a low-frequency DC-DC converter.

On the contrary, in the low-frequency DC-DC converter 38, since the output impedance in the high frequency range FE is high, the response of the output current with respect to the change of the load current is slow, as described in FIG. 12. That is, in the low-frequency DC-DC converter 38, the followability with respect to the fluctuation of the load current of high frequency is lower than that of the high-frequency DC-DC converter 36.

Accordingly, in the case where the frequency of the load current of the processor 28 is high, a high-frequency direct current corresponding thereto, namely, a direct current having a fast temporal variation, is supplied from the high-frequency DC-DC converter 36. Furthermore, even when the frequency of the load current of the processor 28 is high, a low-frequency direct current, namely, a direct current having a slower temporal variation than that of the electric current supplied from the high-frequency DC-DC converter 36, is supplied from the low-frequency DC-DC converter 38.

As represented in FIG. 7, the low-frequency current C2 supplied from the low-frequency DC-DC converter 38 and the high-frequency current C1 supplied from the high-frequency DC-DC converter 36 are synthesized and supplied to the processor 28. That is, two converters, i.e. the low-frequency DC-DC converter 38 and the high-frequency DC-DC converter 36, are in charge of supplying an electric current to the processor 28.

As illustrated in FIG. 2, in the present embodiment, the low-frequency DC-DC converter 38 is larger in size than the high-frequency DC-DC converter 36, and is capable of supplying a larger current.

The converter mounting board 22 according to the present embodiment is used in various kinds of electronic devices such as a personal computer, various kinds of servers, an image forming device, an information storage device, and a line switching device.

Next, the actions of the present embodiment will be described.

In the converter mounting board 22 according to the present embodiment, as represented in FIG. 7, the electric current C2 supplied from the low-frequency DC-DC converter 38 and the electric current C1 supplied from the high-frequency DC-DC converter 36 are synthesized and supplied to the processor 28.

As represented in FIG. 12, the low-frequency DC-DC converter 38 has a low followability with respect to the load current having a high frequency as compared with the high-frequency DC-DC converter 36. Whereas, as represented in FIG. 11, the high-frequency DC-DC converter 36 has a high followability with respect to the load current having a high frequency. For that reason, even if the frequency of the load current is high (e.g., when the temporal variation of the current is fast), an electric current following the load current having a high frequency may be supplied from the high-frequency DC-DC converter 36. Furthermore, by synthesizing the output current of the low-frequency DC-DC converter 38 and the output current of the high-frequency DC-DC converter 36, a direct current having a current value corresponding to that of the load current may be supplied to the processor 28.

The high-frequency DC-DC converter 36 is mounted on the component mounting substrate 24 and an electric current having a high frequency does not flow through the pillars 54 and 56. Therefore, the generation of a radiation noise caused by a high frequency electric current flowing through the pillars 54 and 56 may be suppressed.

More specifically, when an electric current flows through the pillars 54 and 56, a power loss is generated. When the magnitude of the electric current varies, the amount of a power loss varies as well in the pillars 54 and 56. Since the electric power increases in proportion to the square of an electric current, the variation width of a power loss is increased even if the current variation value is small in the case of a large current. Since the current variation is generated at a high frequency, a radiation noise becomes larger. In the present embodiment, since the variation of the electric current flowing through the pillars 54 and 56 is small and the current variation frequency is lowered, the generation of a radiation noise from the pillars 54 and 56 may be suppressed efficiently.

In order to suppress the generation of a radiation noise caused by a high-frequency alternating current as described above, a structure is considered in which a converter corresponding to a high frequency and a large current is mounted on the component mounting substrate 24 in the vicinity of the processor. However, it is often the case that the processor corresponding to a large current has a large size. When a large converter is mounted near the processor, a mounting space available for other electronic components is narrowed in the vicinity of the processor.

In the converter mounting board 22 according to the present embodiment, the electric current supplied from the high-frequency DC-DC converter 36 and the electric current supplied from the low-frequency DC-DC converter 38 are synthesized and supplied to the processor 28 as a load current. Accordingly, for example, as compared with a structure in which one DC-DC converter corresponding to a larger current is mounted near a processor, the high-frequency DC-DC converter 36 of the present embodiment mounted near the processor 28 has a small size. Thus, a wide mounting space available for other components (one example of which is the electronic component 30 illustrated in FIG. 2) may be secured in the vicinity of the processor 28.

Furthermore, since the converter disposed near the processor 28 is the high-frequency DC-DC converter 36 having a small size, the degree of freedom of arrangement of the high-frequency DC-DC converter 36 is high as compared with a structure in which a large converter is disposed near the processor 28.

In the converter mounting board 22 according to the present embodiment, the high-frequency DC-DC converter 36 is mounted on the component mounting substrate 24, and the low-frequency DC-DC converter 38 is mounted on the converter mounting substrate 26. That is, the low-frequency DC-DC converter 38 is mounted on a substrate which is a member separate from the substrate on which the high-frequency DC-DC converter 36 is mounted. Accordingly, as compared with a structure in which the low-frequency DC-DC converter 38 is mounted on the component mounting substrate 24, it is not necessary to provide a space available for mounting the low-frequency DC-DC converter 38 on the component mounting substrate 24. This enables a wide mounting space available for other components (e.g., the electronic component 30 illustrated in FIG. 2) to be secured in the vicinity of the processor 28 while suppressing the size of the component mounting substrate 24 from being increased.

In the converter mounting board 22 according to the present embodiment, the high-frequency DC-DC converter 36 is smaller in size than the low-frequency DC-DC converter 38. In other words, the low-frequency DC-DC converter 38 may employ a structure capable of outputting an electric current larger than the electric current output by the high-frequency DC-DC converter 36. This enables the current value output from the high-frequency DC-DC converter 36 to be reduced, thereby suppressing the generation of a radiation noise caused by a high frequency and large current flowing through the wiring lines disposed within the component mounting substrate 24.

In the component mounting substrate 24, the power supply wiring lines 40 are sandwiched by the ground wiring lines 42. This enables the ground wiring lines 42 to suppress the generation of a radiation noise caused by a high-frequency current flowing through the power supply wiring lines 40.

A direct current flows through the pillars 54 and 56 between the low-frequency DC-DC converter 38 and the processor 28. Since the pillars 54 and 56 are disposed between the component mounting substrate 24 and the converter mounting substrate 26, the pillars 54 and 56 are less limited by the shape and material thereof as compared with, for example, the wiring lines existing within the component mounting substrate 24. This enables a desired shape or material to be easily selected in order to allow the current output from the low-frequency DC-DC converter 38 to flow through the pillars 54 and 56.

In the present embodiment, even if the outer surfaces of the pillars 54 and 56 are exposed, the radiation noise from the pillars 54 and 56 may be suppressed as described above. Since a structure for suppressing the radiation noise is unnecessary, the structure of the pillars 54 and 56 may be simplified, and the structure of the converter mounting board 22 may also be simplified.

The pillars 54 and 56 are connected to the component mounting substrate 24 from the side opposite to the component mounting surface 24A. By positioning the pillars 54 and 56 near the power supply terminals 32C when the component mounting substrate 24 is viewed in a plan view, the wiring length from the pillars 54 and 56 to the power supply terminals 32C may be shortened. Since the wiring length from the pillars 54 and 56 to the power supply terminals 32C may be shortened, a power reduction, which may be caused when the wiring length is large, may be suppressed. For example, even if the thickness of the wiring lines disposed within the component mounting substrate 24 and used for supplying an electric current to the processor 28 is thin (the electric resistance is large), a power reduction may be suppressed.

Furthermore, the positions of the pillars 54 and 56 may be set according to the positions of the power supply terminals 32C. Thus, the degree of freedom of arrangement of the power supply terminals 32C increases.

Next, a second embodiment will be described. In the second embodiment, the same elements and members as those of the first embodiment will be designated by like reference numerals and the detailed descriptions thereof will be omitted.

Figure 13:
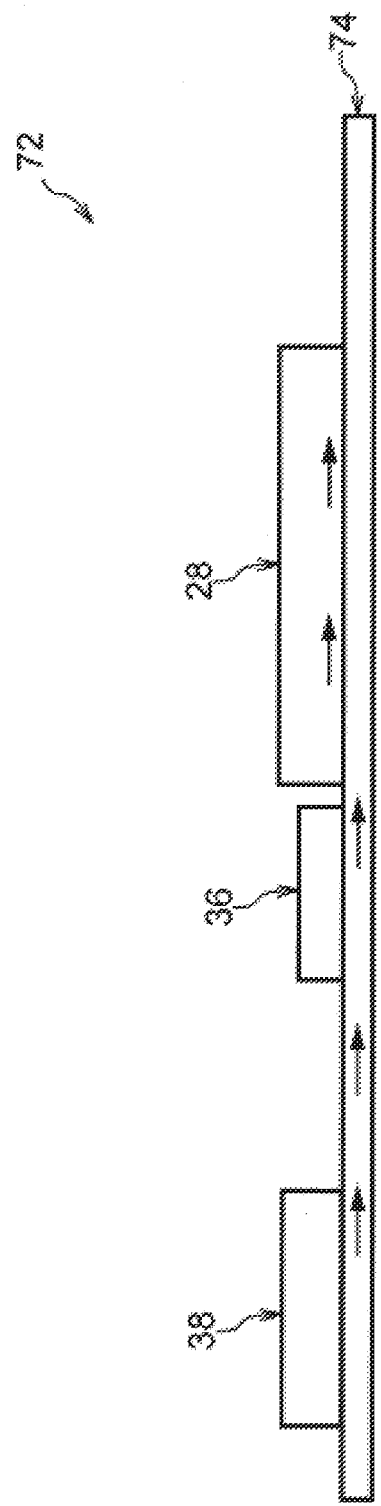
FIG. 13 is a front view illustrating a converter mounting board according to a second embodiment.
Figure 14:
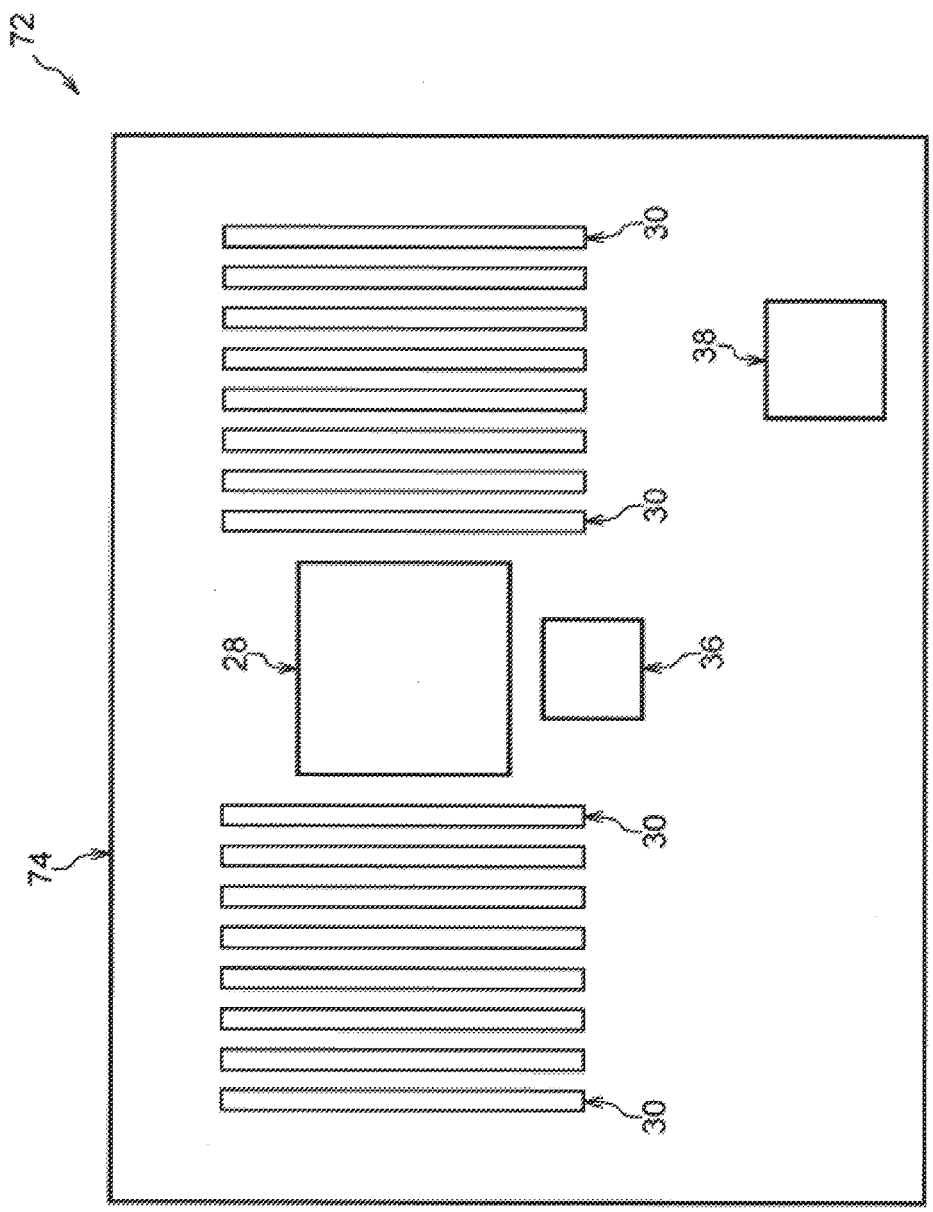
FIG. 14 is a plan view illustrating the converter mounting board according to the second embodiment.
Figure 15:
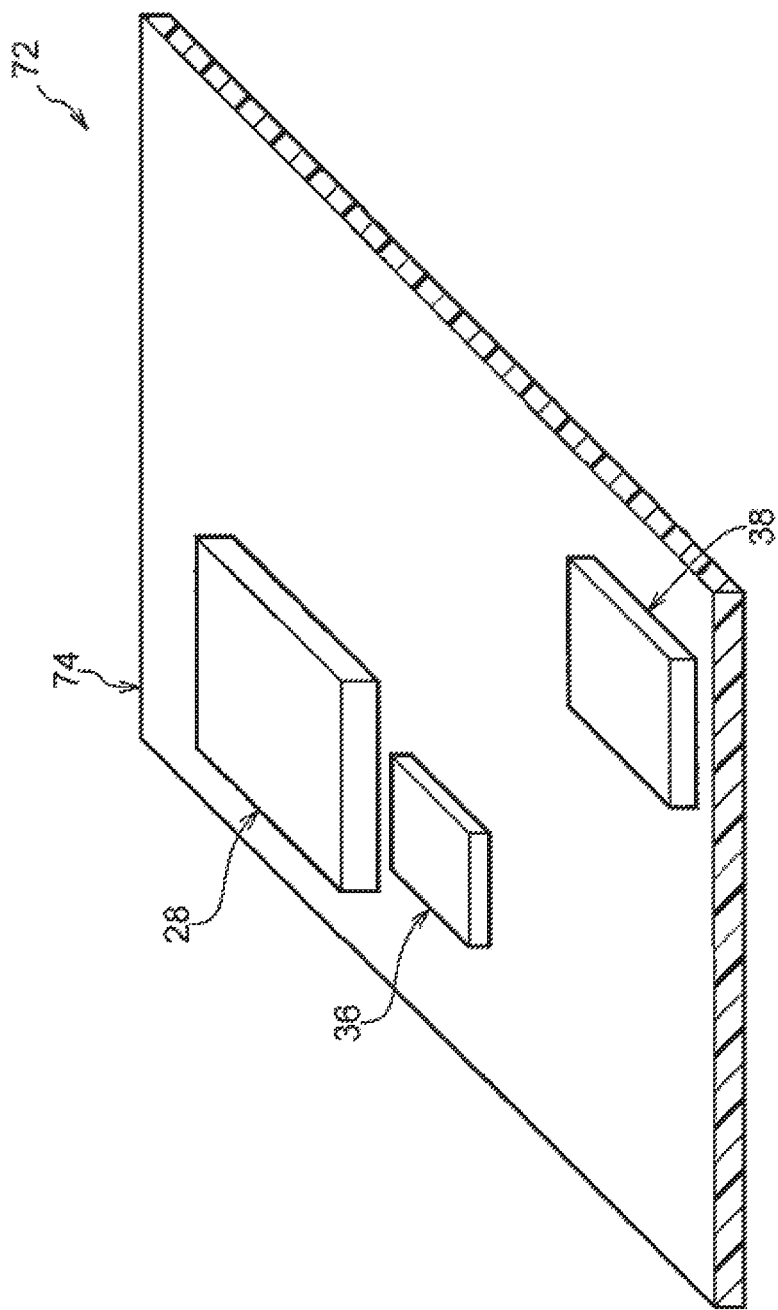
FIG. 15 is a perspective view illustrating the converter mounting board according to the second embodiment.

As illustrated in FIGS. 13 to 15, a converter mounting board 72 according to a second embodiment includes a component mounting substrate 74. In the second embodiment, the low-frequency DC-DC converter 38 is mounted on the component mounting substrate 74, in addition to the processor 28 and the high-frequency DC-DC converter 36. FIG. 15 illustrates the component mounting substrate 74 in a partially cut-out state in which the cut surfaces are indicated with hatched lines, as in FIG. 3.

Figure 16:
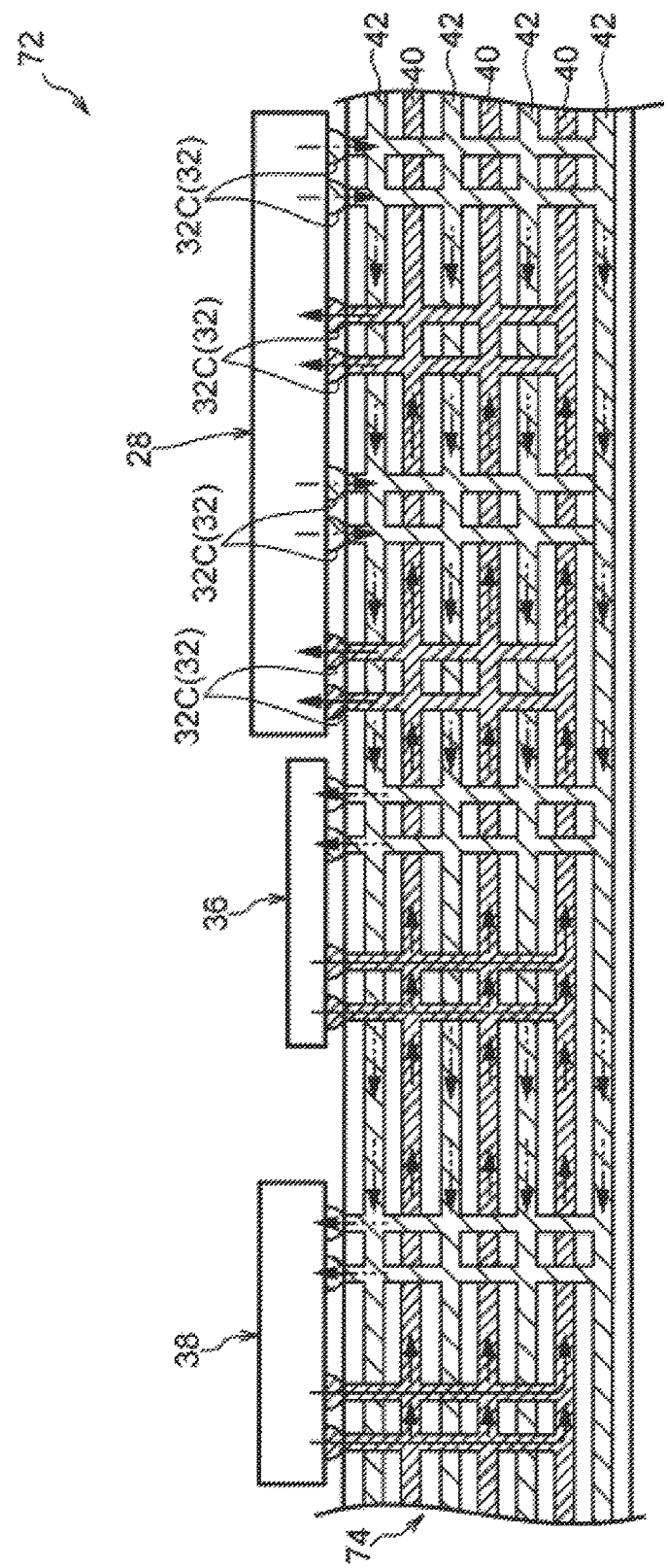
FIG. 16 is a vertical sectional view illustrating the converter mounting board according to the second embodiment.

As illustrated in FIG. 16, in the second embodiment, the power supply wiring lines 40 and the ground wiring lines 42 are also connected to the low-frequency DC-DC converter 38 within the component mounting substrate 74.

In addition, a high-frequency direct current output from the high-frequency DC-DC converter 36 and a low-frequency direct current output from the low-frequency DC-DC converter 38 are synthesized and supplied to the processor 28.

In the second embodiment, the low-frequency DC-DC converter 38 is mounted at a position farther spaced apart from the processor 28 than the high-frequency DC-DC converter 36. In other words, the high-frequency DC-DC converter 36 is mounted at a position close to the processor 28.

As compared with a structure in which a high-frequency and large converter corresponding to a large current is mounted on the component mounting substrate 24 in the vicinity of the processor, the high-frequency DC-DC converter 36 mounted near the processor 28 is smaller in size. Accordingly, a wide space available for arrangement of other electronic components may be secured around the processor 28.

In the respective embodiments described above, the high-frequency DC-DC converter 36 is mounted on the component mounting substrate 24. That is, the component mounting substrate 24 also serves as a substrate for mounting the high-frequency DC-DC converter 36. Therefore, as compared with a structure in which the high-frequency DC-DC converter 36 is mounted on a separate substrate from the component mounting substrate 24, the number of components is reduced.

In the second embodiment, the low-frequency DC-DC converter 38 is also mounted on the component mounting substrate 74 in addition to the high-frequency DC-DC converter 36. Since the two kinds of converters are mounted on the component mounting substrate 74, the number of components is reduced in the second embodiment.

As long as the high-frequency DC-DC converter is disposed close to the processor (electronic component) and the low-frequency DC-DC converter is located far away from the processor (electronic component), the arrangement of the high-frequency DC-DC converter and the low-frequency DC-DC converter is not limited to the aforementioned arrangement. For example, even if the low-frequency DC-DC converter is mounted on the component mounting substrate and the high-frequency DC-DC converter is mounted on a separate member from the component mounting substrate, the high-frequency DC-DC converter may be disposed close to the electronic component and the low-frequency DC-DC converter may be located far away from the electronic component.

In the respective embodiments described above, the processor 28 has been illustrated as an exemplary electronic component. However, the electronic component is not limited to the processor. The processor 28 may be, for example, a semiconductor chip that requires a large load current having a large temporal variation (a high frequency). In particular, a high-performance processor often requires a large load current and the amount of the load current often varies rapidly. Therefore, by applying the structures of the respective embodiments described above, an arrangement space available for other components may be secured around the processor, and at the same time, a radiation noise may be reduced even if an electric current supplied to the processor varies at a high frequency.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A converter mounting board comprising:
    an electronic component which is supplied with an electric current;
    a high-frequency DC-DC converter that supplies a first direct current corresponding to a fast change of the electric current to the electronic component; and
    a low-frequency DC-DC converter located farther away from the electronic component than the high-frequency DC-DC converter and that supplies a second direct current corresponding to a slow change of the electric current slower than the first direct current corresponding to the fast change of the electric current to the electronic component,
    wherein
        the high-frequency DC-DC converter and the low-frequency DC-DC converter independently output the first direct current and the second direct current to the electronic component, respectively,
        the first direct current and the second direct current output from the high-frequency DC-DC converter and the low-frequency DC-DC converter, respectively, are synthesized to be supplied to the electronic component, and
        when a frequency of a load current of the electronic component is higher than a predetermined frequency, the first direct current from the high-frequency DC-DC converter is supplied to the electronic component.

2. The converter mounting board according to claim 1, further comprising:
    a component mounting substrate on which the electronic component is mounted.

3. The converter mounting board according to claim 2, wherein the high-frequency DC-DC converter is mounted on the component mounting substrate.

4. The converter mounting board according to claim 2, wherein the low-frequency DC-DC converter is mounted on the component mounting substrate.

5. The converter mounting board according to claim 1, further comprising:
    a converter mounting substrate on which the low-frequency DC-DC converter is mounted.

6. The converter mounting board according to claim 1, wherein the high-frequency DC-DC converter is smaller in size than the low-frequency DC-DC converter.

7. The converter mounting board according to claim 1, further comprising:
    a shield wiring line that shields a current wiring line that is disposed between the high-frequency DC-DC converter and the electronic component.

8. A converter mounting board comprising:
    an electronic component which is supplied with an electric current;
    a component mounting substrate on which the electronic component is mounted;
    a high-frequency DC-DC converter mounted on the component mounting substrate and that supplies a first direct current corresponding to a fast change of the electric current to the electronic component;
    a converter mounting substrate disposed separately from the component mounting substrate; and
    a low-frequency DC-DC converter mounted on the converter mounting substrate and that supplies a second direct current corresponding to a slow change of the electric current slower than the first direct current corresponding to the fast change of the electric current to the electronic component,
    wherein
        the high-frequency DC-DC converter and the low-frequency DC-DC converter independently output the first direct current and the second direct current to the electronic component, respectively,
        the first direct current and the second direct current output from the high-frequency DC-DC converter and the low-frequency DC-DC converter, respectively, are synthesized to be supplied to the electronic component, and
        when a frequency of a load current of the electronic component is higher than a predetermined frequency, the first direct current from the high-frequency DC-DC converter is supplied to the electronic component.

9. The converter mounting board according to claim 8, further comprising:
    a pillar disposed between the component mounting substrate and the converter mounting substrate so that an electric current supplied from the low-frequency DC-DC converter flows through the pillar.

10. The converter mounting board according to claim 9, wherein the pillar has an exposed outer surface.

11. The converter mounting board according to claim 9, wherein the pillar is coupled to the component mounting substrate from a side opposite to a component mounting surface of the component mounting substrate on which the electronic component is mounted.

* * * * *